United States Patent
Iverson

(10) Patent No.: US 10,831,962 B1
(45) Date of Patent: Nov. 10, 2020

(54) RESISTOR NETWORK GENERATION FROM POINT-TO-POINT RESISTANCE VALUES

(71) Applicant: Synopsys, Inc., Mountain View, CA (US)

(72) Inventor: Ralph Benhart Iverson, Arlington, MA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/576,617

(22) Filed: Sep. 19, 2019

Related U.S. Application Data

(60) Provisional application No. 62/733,317, filed on Sep. 19, 2018.

(51) Int. Cl.
| | | |
|---|---|---|
| *G06F 17/50* | (2006.01) | |
| *G06F 30/367* | (2020.01) | |
| *G06F 30/3308* | (2020.01) | |
| *G06F 30/3323* | (2020.01) | |
| *G06F 30/22* | (2020.01) | |
| *G06F 30/337* | (2020.01) | |
| *G06F 30/398* | (2020.01) | |

(52) U.S. Cl.
CPC ........ *G06F 30/367* (2020.01); *G06F 30/3308* (2020.01); *G06F 30/3323* (2020.01); *G06F 30/22* (2020.01); *G06F 30/337* (2020.01); *G06F 30/398* (2020.01)

(58) Field of Classification Search
CPC .. G06F 30/22; G06F 30/3308; G06F 30/3323; G06F 30/337; G06F 30/398; G06F 30/367

USPC ............ 716/107, 102, 111, 136; 703/14
See application file for complete search history.

(56) References Cited

U.S. PATENT DOCUMENTS

| | | | | | |
|---|---|---|---|---|---|
| 5,469,366 | A * | 11/1995 | Yang | .............. | G06F 30/367 716/113 |
| 6,182,269 | B1 * | 1/2001 | Laubhan | ............. | G06F 30/33 716/113 |
| 6,421,430 | B1 * | 7/2002 | Hollenbach | ........... | H04L 12/10 379/93.05 |
| 7,016,820 | B2 * | 3/2006 | Kimura | ............. | G06F 30/367 703/2 |
| 7,082,583 | B2 * | 7/2006 | Guo | .............. | G06F 30/367 716/115 |
| 7,716,620 | B2 * | 5/2010 | Agarwal | ............. | G06F 30/367 716/126 |

(Continued)

*Primary Examiner* — Phallaka Kik
(74) *Attorney, Agent, or Firm* — Haynes Beffel & Wolfeld, LLP; Andrew L. Dunlap; Sikander Khan

(57) ABSTRACT

The technology disclosed generates resistor values for networks with more than four terminals. In this case, all resistors in the network can be found by updating point-to-point (P2P) values as the network is reduced. To find the resistor value $R_{AB}$ between two terminals, A and B, the other terminals are effectively shorted together, reducing the network. Such reduction does not affect $R_{AB}$. The point-to-point (P2P) resistance values are recalculated as other terminals are shorted. Once reduced to four terminals, the P2P resistance values are sufficient to determine $R_{AB}$. Given six P2P resistance values, it generates the six resistor values required for the resistor network connecting the four terminals.

18 Claims, 15 Drawing Sheets

(56) References Cited

U.S. PATENT DOCUMENTS

| | | | |
|---|---|---|---|
| 7,987,439 B2* | 7/2011 | Che | G06F 30/367 |
| | | | 716/103 |
| 10,558,772 B1* | 2/2020 | Ho | G06F 30/367 |
| 2004/0004470 A1* | 1/2004 | Yoshida | H02M 3/1563 |
| | | | 323/284 |
| 2013/0147447 A1* | 6/2013 | Liu | G05F 3/30 |
| | | | 323/273 |

* cited by examiner

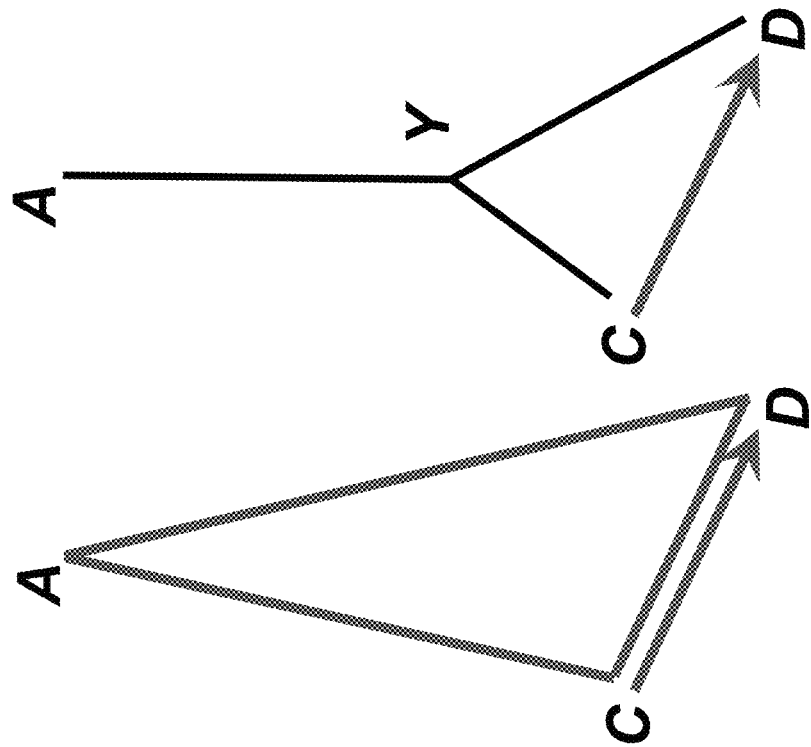
FIG. 10C
FIG. 10B
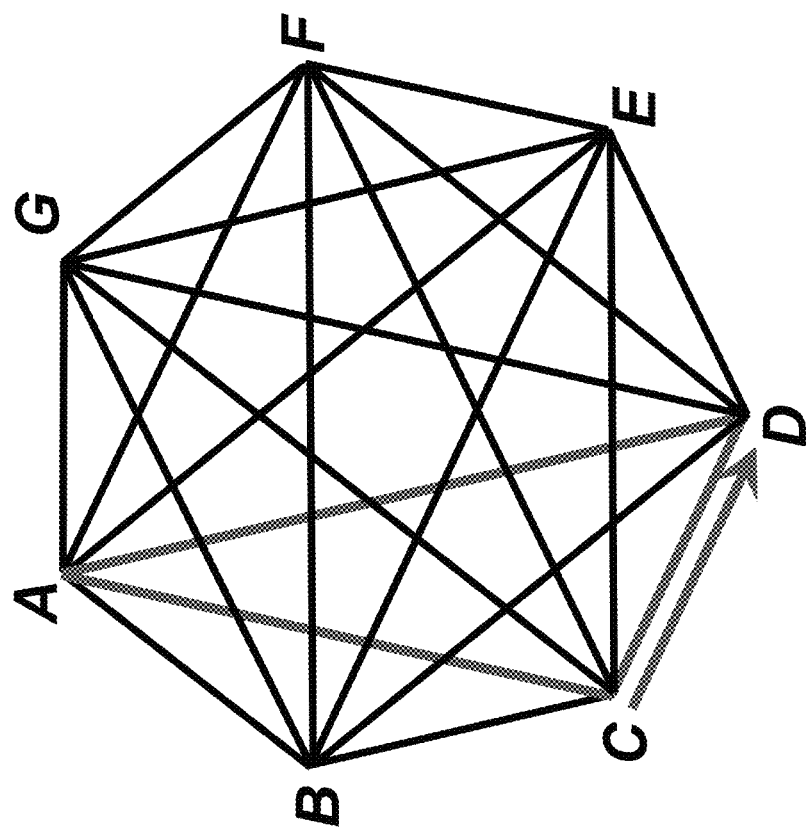
FIG. 10A

RESISTOR NETWORK GENERATION FROM POINT-TO-POINT RESISTANCE VALUES

PRIORITY APPLICATION

This application claims the benefit of U.S. Provisional Patent Application No. 62/733,317 filed 19 Sep. 2018, which is incorporated herein by reference.

INCORPORATION

This application incorporates by reference U.S. Nonprovisional patent application Ser. No. 16/568,984 filed 12 Sep. 2019 (SYNP 3303-2/3303US02).

FIELD OF THE TECHNOLOGY DISCLOSED

The technology disclosed relates to the modeling of integrated circuit devices in computer-aided design (CAD) and electronic design automation (EDA) systems, and more specifically to modeling and simulating conductors in an integrated circuit (IC).

BACKGROUND

An integrated circuit (IC) is a set of electronic circuits that integrates a large number of semiconducting transistors into a small chip. Among the most advanced integrated circuits are microprocessors, memory chips, programmable logic sensors, power management circuits, etc. Advances in IC technology have led to size reduction of transistors, enabling greater densities of devices and circuits in IC chips and enhanced performance.

A computer simulation is a simulation, run on a single computer, or a network of computers, to reproduce behavior of a physical system. The simulation applies an abstract model to simulate the system. Computer simulations have become a useful part of mathematical modeling of many natural systems in physics (computational physics), electronics, chemistry, and engineering. Simulation of a system is represented as the computer execution of the system's model. Computer simulation may be used to explore and gain insights into new technology and to estimate the performance or other behaviors of complex systems.

The resistance model for a modern device may involve several terminals and one or more device terminals. Specifically, when device terminals are involved, desired properties include point-to-point (P2P) resistance, which is not readily translated into a network of resistors. Because circuit simulators involve resistor networks rather than P2P resistance. No known product (commercial or other) offers accurate resistor models involving four or more terminals.

Generation of P2P-based resistor networks for two- and three-terminal configurations is standard for Rg/3 modeling. Support for four-terminal networks is required for Rg/3 modeling when the gate of a MOSFET includes a single via. A gate with multiple vias, however, requires support for larger networks (more terminals) to avoid approximations. No known methods generate such resistor networks.

An opportunity arises to determine resistor values between n terminals of a network using known point-to-point resistance values.

SUMMARY

Roughly described, a system and a method are provided that determine resistor values between n terminals of a network using known point-to-point resistance values between the n terminals.

A resistor network is initialized in which nodes represent the n terminal and edges between the nodes represent the known point-to-point resistance values. The resistor network is stored in a database in the memory.

The resistor values between each of the nodes is determined by initializing a merged version of the resistor network by combining a starting node pair from among the nodes into a merged node, using the known point-to-point resistance values to determine new known point-to-point resistance values (i) between the merged node and unmerged nodes in the merged version of the resistor network and (ii) between the unmerged nodes in the merged version of the resistor network, iteratively shrinking the merged version of the resistor network such that, at each successive iteration, the merged version of the resistor network has an additional one of the nodes merged into the merged node and therefore one less unmerged node, and at each iteration, determining the new known point-to-point resistance values, when the merged version of the resistor network has iteratively shrunken to having only three unmerged nodes, using a four-terminal solution to determine the resistor values between the three unmerged nodes, and terminating the iterative shrinking, and until the resistor values between each of the nodes are determined, initializing different merged versions of the resistor network by combining different starting node pairs from among the nodes into the merged node and using the iterative shrinking and the four-terminal solution to determine the resistor values between different combinations of the three unmerged nodes.

In one embodiment, the known point-to-point resistance values are used to determine the new known point-to-point resistance values between the merged node and the unmerged nodes in the merged version of the resistor network by applying a three-terminal solution that uses the merged node and one other unmerged node.

In one embodiment, the three-terminal solution treats nodes in the merged version of the resistor network other than the merged node and one other unmerged node as floating nodes that are unconnected and have no net input current and no voltage.

In one embodiment, the known point-to-point resistance values are used to determine the new known point-to-point resistance values between the unmerged nodes in the merged version of the resistor network by applying a four-terminal solution that uses the merged node and two other unmerged node.

In one embodiment, the four-terminal solution treats nodes in the merged version of the resistor network other than the merged node and two other unmerged node as floating nodes that are unconnected and have no net input current and no voltage.

In one embodiment, the merged node is generated by shorting and connecting those nodes that are merged into the merged node and assigning them a same voltage.

One or more embodiments of the technology disclosed or elements thereof can be implemented in the form of a computer product including a non-transitory computer readable storage medium with computer usable program code for performing the method steps indicated. Furthermore, one or more embodiments of the technology disclosed or elements thereof can be implemented in the form of an apparatus including a memory and at least one processor that is coupled to the memory and operative to perform exemplary method steps. Yet further, in another aspect, one or more embodiments of the technology disclosed or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

These and other features, aspects, and advantages of the invention will become apparent from the following detailed description of illustrative embodiments thereof, which is to be read in connection with the accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The color drawings also may be available in PAIR via the Supplemental Content tab.

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings, in which:

FIGS. 10A, 10B, and 10C show one embodiment of determining new point-to-point (P2P) resistance values between a merged node and an unmerged node in the merged resistor network.

DETAILED DESCRIPTION

The following discussion is presented to enable any person skilled in the art to make and use the technology disclosed, and is provided in the context of a particular application and its requirements. Various modifications to the disclosed implementations will be readily apparent to those skilled in the art, and the general principles defined herein may be applied to other implementations and applications without departing from the spirit and scope of the technology disclosed. Thus, the technology disclosed is not intended to be limited to the implementations shown, but is to be accorded the widest scope consistent with the principles and features disclosed herein.

Introduction

We propose a calculator that converts a complete set of point-to-point (P2P) resistance values into a representative resistance network. A structure with n terminals has $n*(n-1)/2$ P2P resistance values, and can be represented by a network of $n*(n-1)/2/$.

A "gold" resistor network that satisfies Rg/3 considerations and works with multiple vias can require many terminals. Generating a resistance network that matches the P2P values can be accomplished for two or three terminals. Generating a resistance network for four terminals (six P2P conditions) is more challenging. Generating a resistance network for more than four terminals is useful for more complex problems.

The technology disclosed generates resistor values for networks with more than four terminals. In this case, all resistors in the network can be found by updating point-to-point (P2P) values as the network is reduced. To find the resistor value $R_{AB}$ between two terminals, A and B, the other terminals are effectively shorted together, reducing the network. Such reduction does not affect $R_{AB}$. The point-to-point (P2P) resistance values are recalculated as other terminals are shorted. Once reduced to four terminals, the P2P resistance values are sufficient to determine $R_{AB}$. Given six P2P resistance values, it generates the six resistor values required for the resistor network connecting the four terminals.

Figure 3:
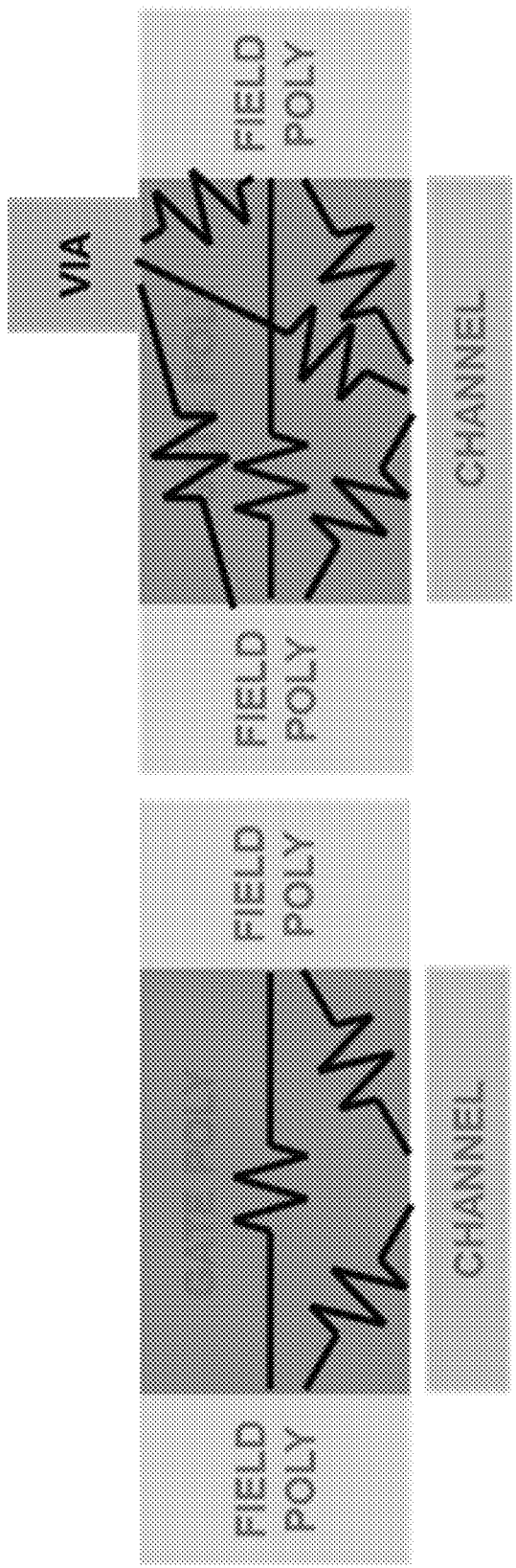
FIG. 3 shows the typical Rg/3 model for a MOSFET (three terminals, three resistors), and an analogous model for a MOSFET with a via (four terminals, six resistors) for which the technology disclosed generates a resistor network in accordance with one embodiment.
Figure 4:
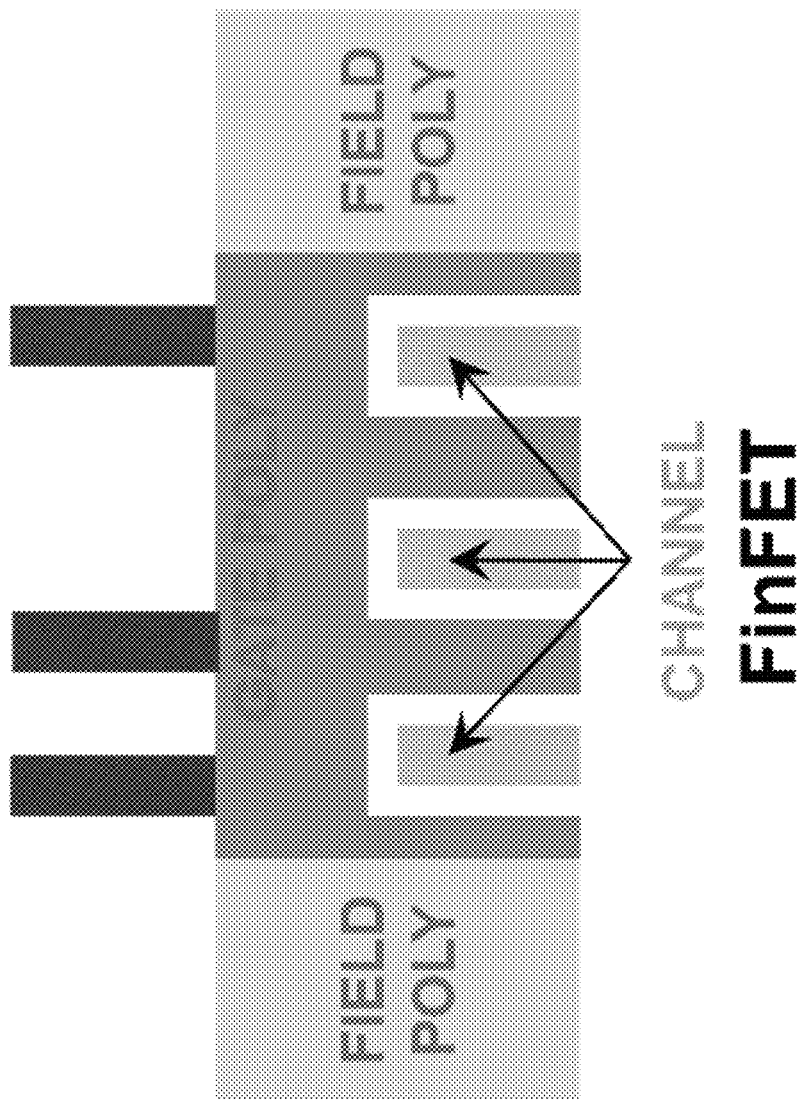
FIG. 4 depicts a FinFet transistor for which the technology disclosed generates a resistor network in accordance with one embodiment.
Figure 5:
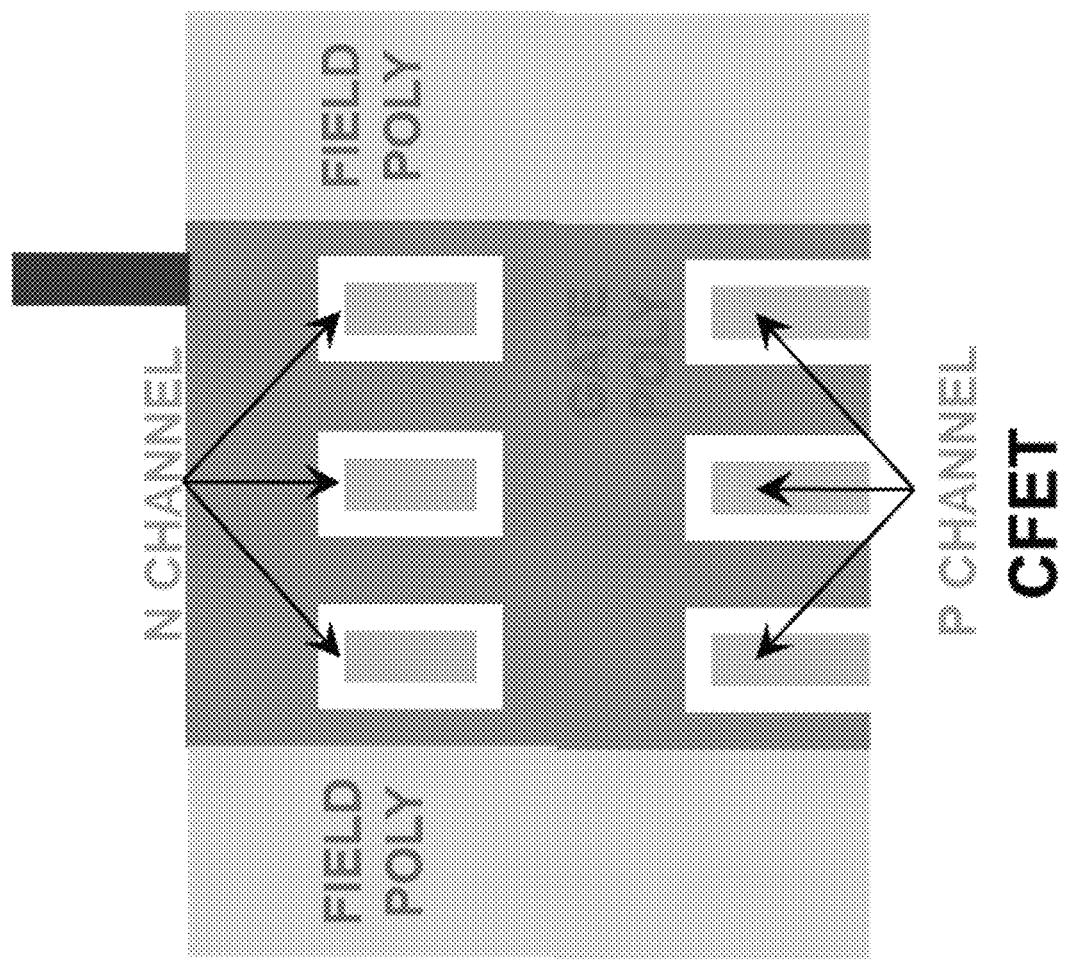
FIG. 5 illustrates a CFET transistor for which the technology disclosed generates a resistor network in accordance with one embodiment.

One application is for a MOSFET or FinFet with multiple vias on the gate and is illustrated in FIG. 3 and FIG. 4, respectively. This example involves six terminals: three vias, two edges (field poly), and one device. The ten P2P resistance values involving the three vias and the two edges are determined by 1D formulas. The P2P resistance from each of these five terminals to the device provide five more P2P resistance values. A six-terminal resistor network representation can satisfy these fifteen P2P conditions with fifteen resistors.

Another application is a CFET transistor, which even with a single via exceeds four terminals. This example involves five terminals: one via, two edges, and two devices. The P2P resistance between the via and the two edges provide three of the ten point-to-point (P2P) values required to find the five-terminal network. Another six P2P values involve the resistance between each of the two device terminals and each of the three via/edge terminals. The P2P value between the n- and p-channel devices is the tenth P2P value. A five-terminal resistor network representation can satisfy these ten P2P conditions with ten resistors.

Electronic Design Automation

Figure 1:
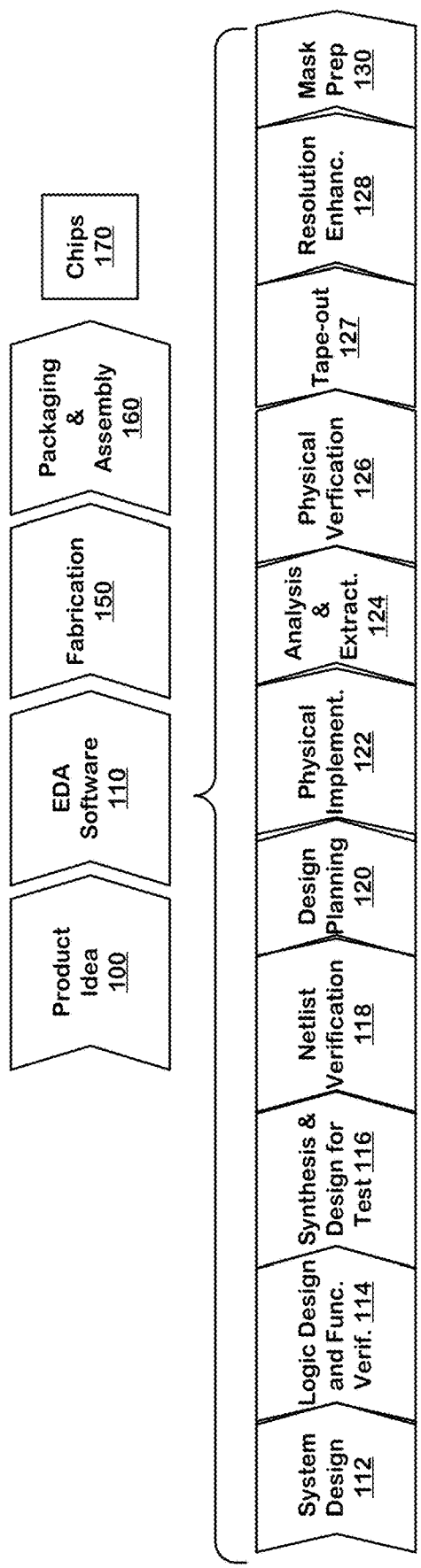
FIG. 1 illustrates EDA tools and process flow for integrated circuit design and manufacturing.

Aspects of the technology disclosed can be used to support an integrated circuit design flow. FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 127). At some point after tape out, the fabrication process (step 150) and packaging and assembly processes (step 160) occur resulting, ultimately, in finished integrated circuit chips (result 170).

The EDA software design process (step 110) is itself composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, System Studio, and DesignWare® products.

Logic design and functional verification (step 114): At this stage, the VHDL or Verilog code for modules in the system is written, and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and Custom Designer products.

Physical implementation (step 122): The placement (positioning of circuit elements) and routing (connection of the same) occurs at this step, as can selection of library cells to perform specified logic functions. Example EDA software products from Synopsys, Inc. that can be used at this step include the Astro, IC Compiler, and Custom Designer products.

Analysis and extraction (step 124): At this step, the circuit function is verified at a transistor level, this, in turn, permits what-if refinement. Example EDA software products from Synopsys, Inc. that can be used at this step include Astro-Rail, PrimeRail, PrimeTime, and Star-RCXT products.

Physical verification (step 126): At this step, various checking functions are performed to ensure correctness for manufacturing, electrical issues, lithographic issues, and circuitry. Example EDA software products from Synopsys, Inc. that can be used at this step include the Hercules product.

Tape-out (step 127): This step provides the "tape out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides mask-making-ready "tape-out" data for production of masks for lithographic use to produce finished chips. Example EDA software products from Synopsys, Inc. that can be used at this step include the CATS(R) family of products. The method for actually making the masks can use any mask making technique, either known today or developed in the future. As an example, masks can be printed using techniques set forth in U.S. Pat. Nos. 6,096,458; 6,057,063; 5,246,800; 5,472,814; and 5,702,847, all incorporated by referenced herein for their teachings of mask printing techniques.

Once the process flow is ready, it can be used for manufacturing multiple circuit designs coming from various designers in various companies. The EDA flow 112-130 will be used by such designers. A combination of the process flow and the masks made from step 130 are used to manufacture any particular circuit.

A Design Technology Co-Optimization (DTCO) process flow provides a simulation flow that enables technology development and design teams to evaluate various transistors, interconnects and process options using a design and technology co-optimization methodology that starts in the pre-wafer research phase. Using techniques described herein, the DTCO process flow may take into account parasitic interconnect resistance of various conductors or interconnects in an IC. The DTCO process flow can be used to evaluate the performance, power, area, and cost of a new or significantly modified IC fabrication technology, including interconnect fabrication technology. Achieving transistor performance and power targets of new IC technology requires consideration of new material options for interconnects, and sometimes also new interconnect mapping in the IC. Parasitic resistances of interconnects are taken into account during the performance evaluation of the new technology.

Generating Resistor Network

Figure 2:
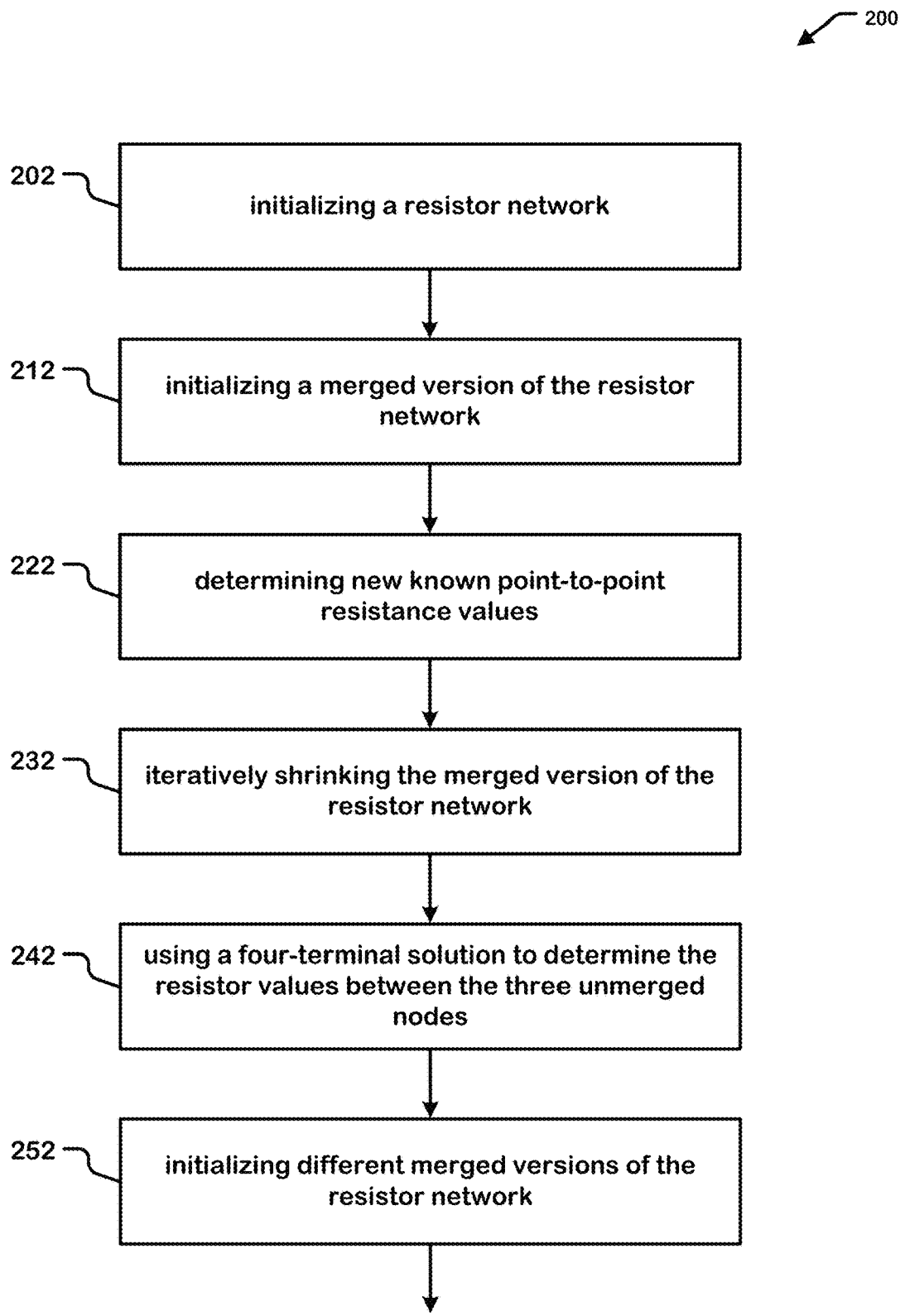
FIG. 2 illustrates a flowchart detail of determining resistor values between n terminals of a network using known point-to-point resistance values between the n terminals.

FIG. 2 illustrates a flowchart detail of determining resistor values between n terminals of a network using known point-to-point resistance values between the n terminals.

Figure 8:
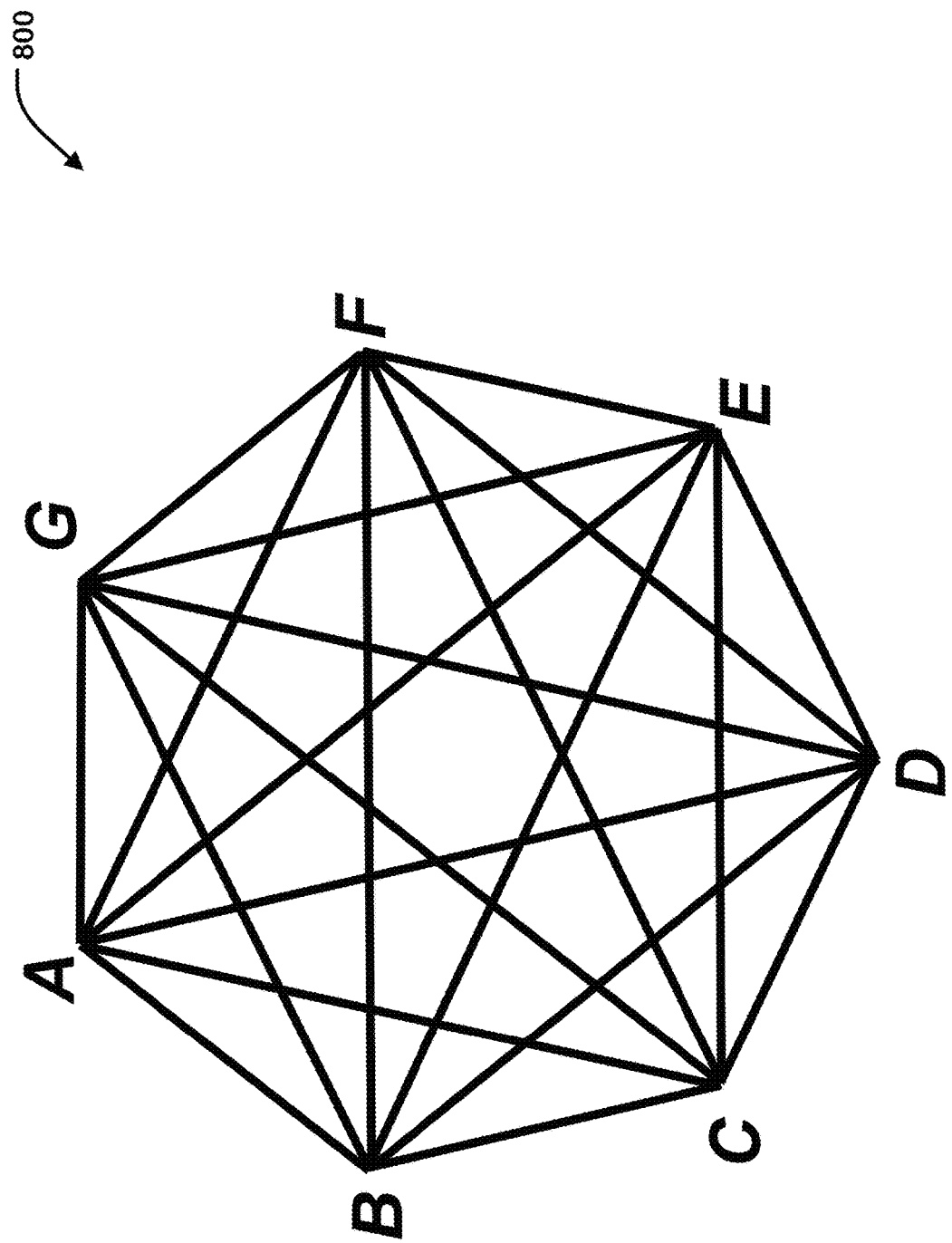
FIG. 8 is an example seven-terminal network for which the technology disclosed generates a resistor network in accordance with one embodiment.

At action 202, a resistor network is initialized in which nodes represent the n terminal and edges between the nodes represent the known point-to-point resistance values. The resistor network is stored in a database in the memory. This is illustrated with respect to FIG. 8 below.

The resistor values between each of the nodes are then determined.

This includes, at action 212, initializing a merged version of the resistor network by combining a starting node pair from among the nodes into a merged node. This is illustrated with respect to FIGS. 9A and 9B below.

This includes, at action 222, using the known point-to-point resistance values to determine new known point-to-point resistance values (i) between the merged node and unmerged nodes in the merged version of the resistor network (this is illustrated with respect to FIGS. 10A, 10B, and 10C below) and (ii) between the unmerged nodes in the merged version of the resistor network (this is illustrated with respect to FIGS. 11A and 11B below).

This includes, at action 232, iteratively shrinking the merged version of the resistor network such that, at each successive iteration, the merged version of the resistor network has an additional one of the nodes merged into the merged node and therefore one less unmerged node and at each iteration, determining the new known point-to-point resistance values. This is illustrated with respect to FIGS. 13A, 13B, and 13C below.

This includes, at action 242, when the merged version of the resistor network has iteratively shrunken to having only three unmerged nodes, using a four-terminal solution to determine the resistor values between the three unmerged nodes, and terminating the iterative shrinking. This is also illustrated with respect to FIGS. 13A, 13B, and 13C below.

Figure 14:
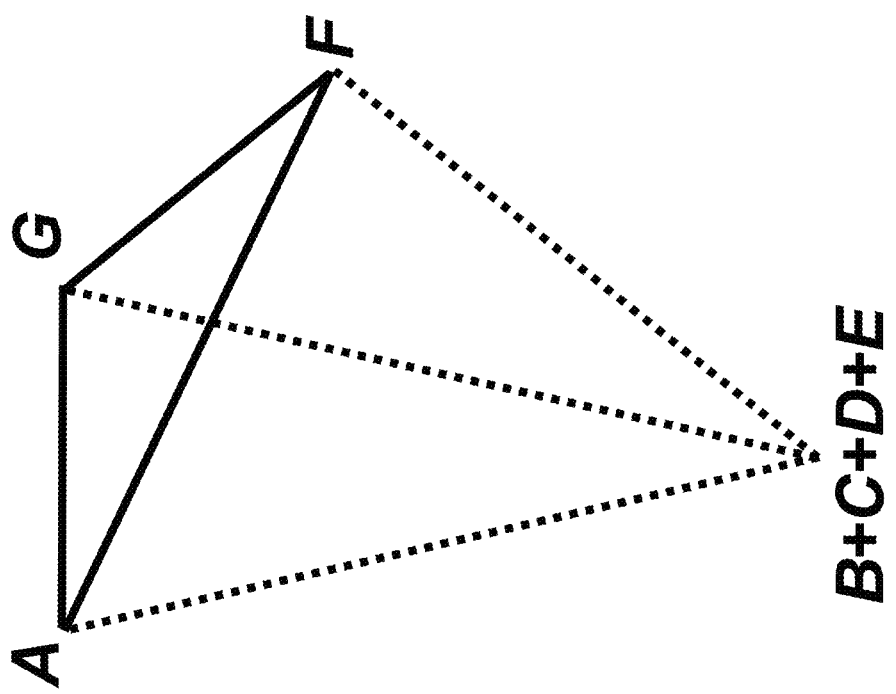
FIG. 14 depicts a four-terminal merged resistor network with three unmerged terminals and a single merged node.

This includes, at action 252, until the resistor values between each of the nodes are determined, initializing different merged versions of the resistor network by combining different starting node pairs from among the nodes into the merged node and using the iterative shrinking and the four-terminal solution to determine the resistor values between different combinations of the three unmerged nodes. This is illustrated with respect to FIG. 14 below.

In one embodiment, the known point-to-point resistance values are used to determine the new known point-to-point resistance values between the merged node and the unmerged nodes in the merged version of the resistor network by applying a three-terminal solution that uses the merged node and one other unmerged node.

In one embodiment, the three-terminal solution treats nodes in the merged version of the resistor network other than the merged node and one other unmerged node as floating nodes that are unconnected and have no net input current and no voltage.

In one embodiment, the known point-to-point resistance values are used to determine the new known point-to-point resistance values between the unmerged nodes in the merged version of the resistor network by applying a four-terminal solution that uses the merged node and two other unmerged node.

In one embodiment, the four-terminal solution treats nodes in the merged version of the resistor network other than the merged node and two other unmerged node as floating nodes that are unconnected and have no net input current and no voltage.

In one embodiment, the merged node is generated by shorting and connecting those nodes that are merged into the merged node and assigning them a same voltage.

FIGS. 8 to 14 show one embodiment of how to establish all twenty-one resistor values in a seven-terminal resistor network 800 (a resistor between each pair of nodes) with the goal of matching twenty-one point-to-point (P2P) resistance values. We will focus on finding some of the resistors. Each line represents a resistor. We will demonstrate one of many possible sequences of reduction.

The ability to generate a resistor network from a set of P2P resistance values is useful for representing the resistance structure of one or more vias on a gate. A single via on a gate requires a four-terminal solution (includes two edge connections). In the two-terminal solution, the resistor value is the same as the P2P resistance.

Three-Terminal Solution

Figure 6:
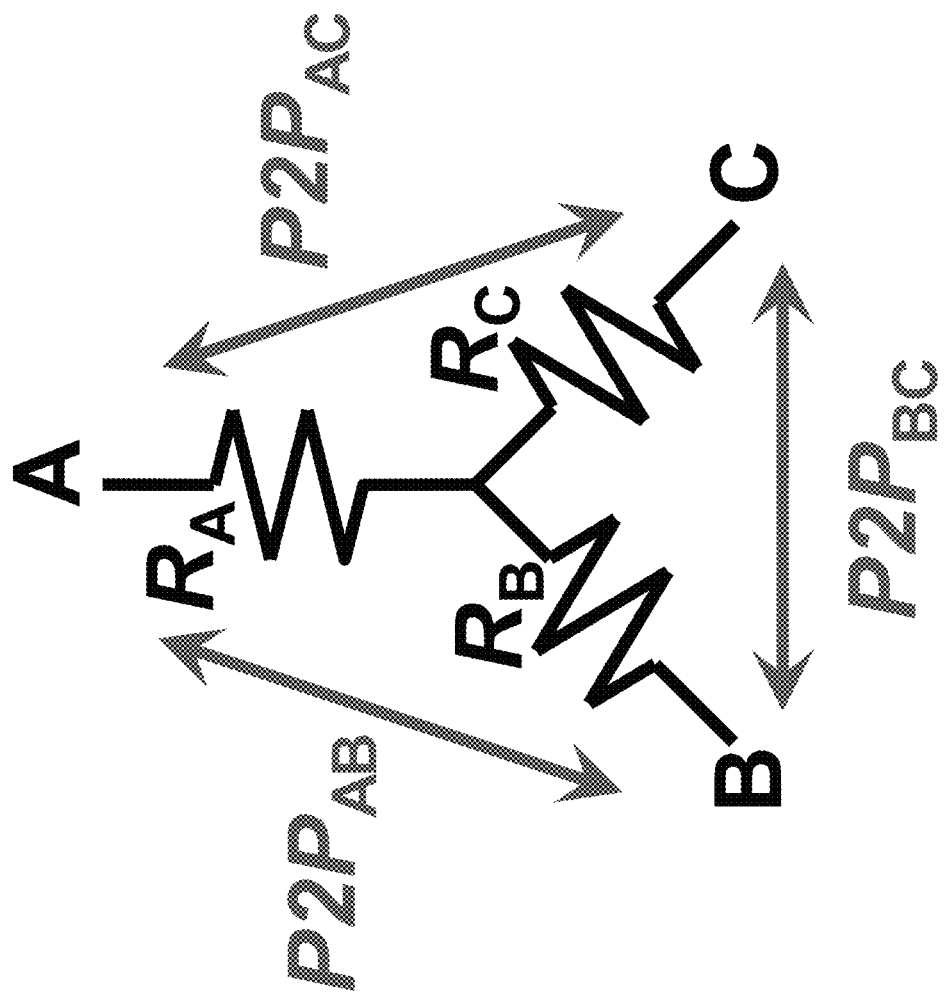
FIG. 6 shows one embodiment of the three-terminal solution used by the technology disclosed to generate a resistor network.

FIG. 6 shows one embodiment of the three-terminal solution used by the technology disclosed to generate a resistor network. The Y-shaped network in FIG. 6 can be resolved using the following three-terminal solution:

$$R_A = (P2P_{AB} + P2P_{AC} - P2P_{BC})/2$$
$$R_B = (P2P_{AB} + P2P_{BC} - P2P_{AC})/2$$
$$R_C = (P2P_{BC} + P2P_{AC} - P2P_{AB})/2$$

Four-Terminal Solution

Figure 7:
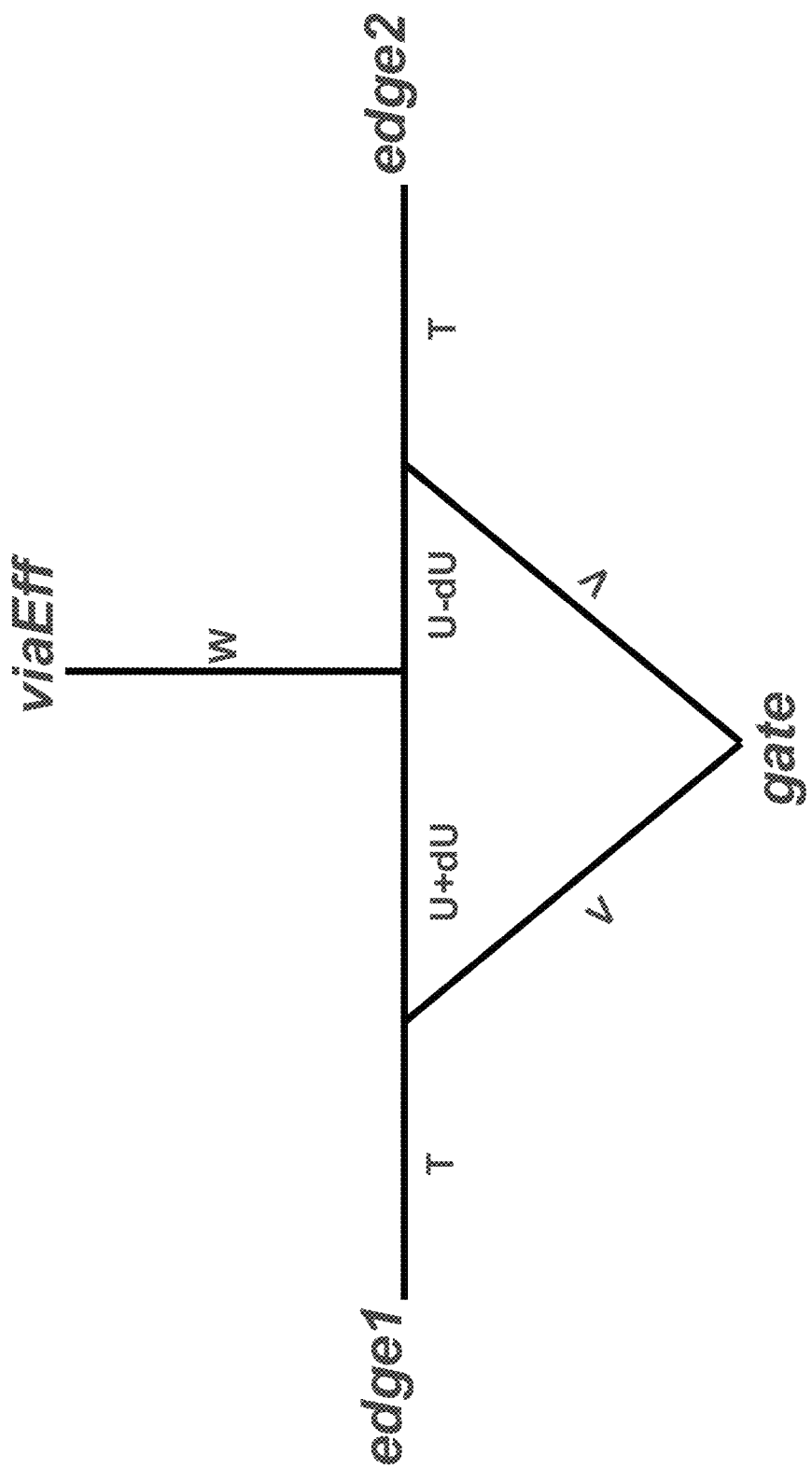
FIG. 7 depicts one embodiment of the four-terminal solution used by the technology disclosed to generate a resistor network.

The technology disclosed also uses a four-terminal solution to generate a resistor network. The four-terminal solution generates six resistor values from six P2P values. One embodiment of the four-terminal solution is shown in FIG. 7. The four-terminal solution grew out of the need to find a network representation for a via on a gate (Rg/3) with two edges. The network representation shown in FIG. 7 can be solved for five P2P resistance values (edge1-to-gate P2P resistance is the same as edge1-to-gate P2P resistance). One implementation allows a solution when edge1-to-gate P2P resistance is different than edge1-to-gate P2P resistance. The current implementation finds the solution for this network, and then reduces the inner nodes, giving a four-terminal and six-resistor representation.

Figure 9B:
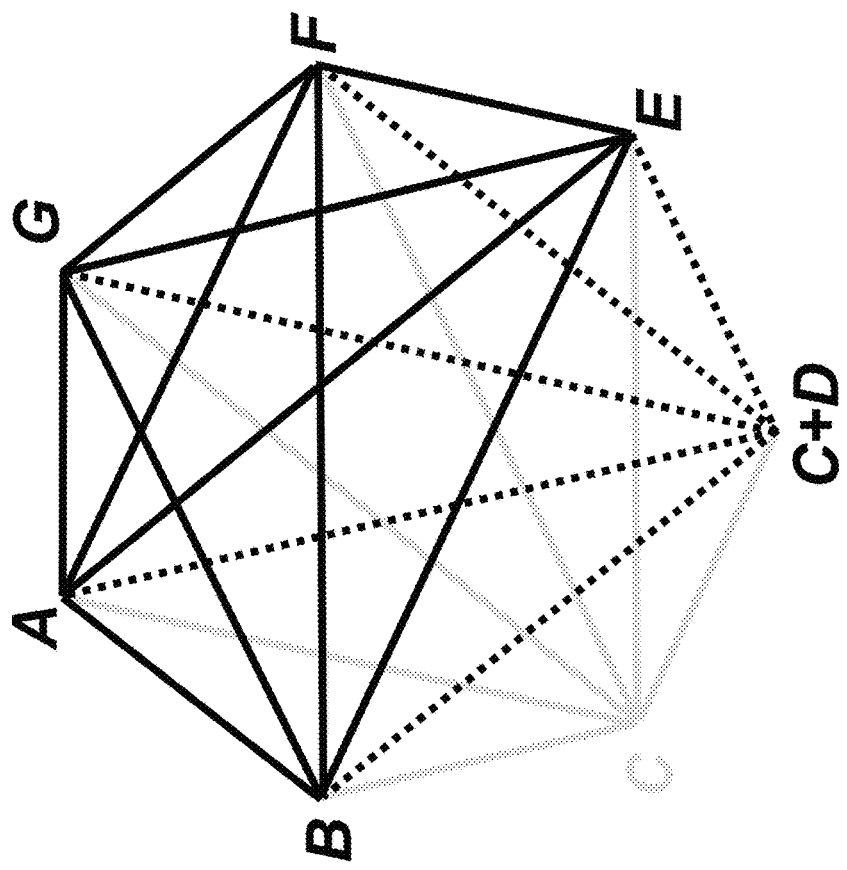
FIG. 9B shows the merged resistor network.
Figure 9A:
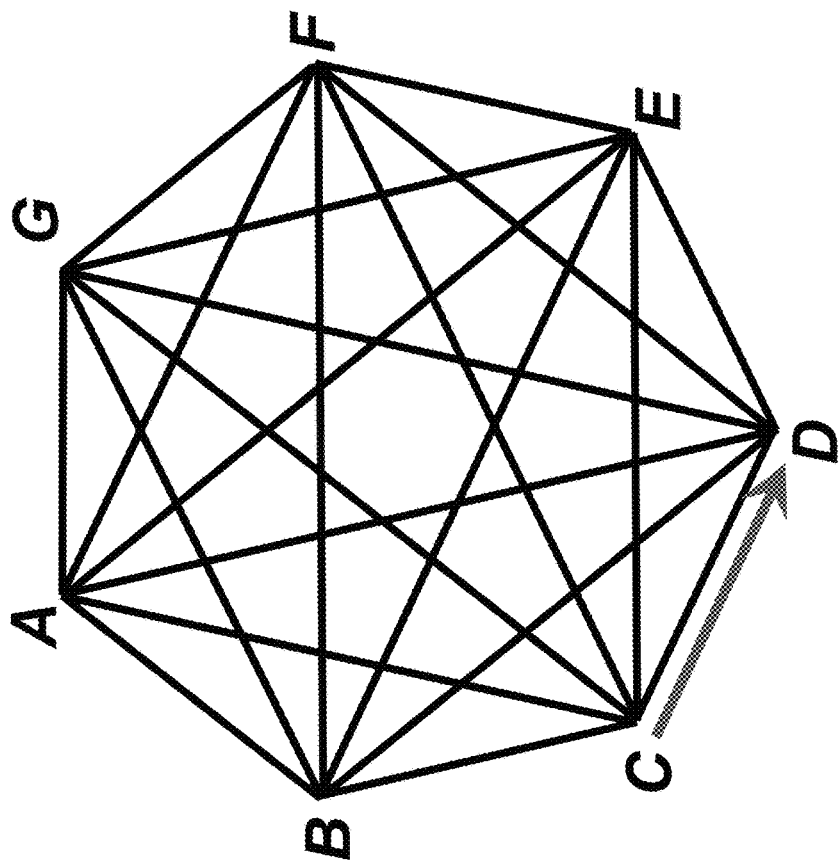
FIG. 9A shows two terminals (nodes) C and D of the resistor network 800 that are merged.

FIG. 9A shows two terminals (nodes) C and D of the resistor network 800 that are merged. FIG. 9B shows the merged resistor network. The first step, shorting terminal C to D (in this example) requires many calculations. After merging terminals, the merged resistor network has the shape shown by the solid and dotted black lines in FIG. 9B. The dotted lines show resistors of the R-network that would change value by this transformation. The solid lines show resistors that retain their original value.

New P2P Resistance Values

The calculations involve finding new P2P resistance values corresponding to the merged resistor network. To establish new P2P resistance values, we must consider two configurations: (1) a three-terminal network involving C, D and one other terminal (A, B, E, F, G); and (2) a four-terminal network involving C, D and two others (A/B, A/E, and so on). By looking at each of these configurations in turn, we find the set of P2P resistance values that correspond to this reduced network.

New P2P Values Between a Merged Node and a Single Unmerged Node

FIGS. 10A, 10B, and 10C show one embodiment of determining new point-to-point (P2P) resistance values between a merged node and an unmerged node in the merged resistor network. We use the original P2P values to find the new P2P value between the merged terminal and any other terminal. To find the P2P value between C+D and A, for example, consider the network after reducing all other terminals (B, E, F, G) as if they were open circuits. This reduced network preserves the P2P values for A-to-C, A-to-D, and C-to-D.

A Y-shaped resistor network that exactly represents these P2P values is given by:

$$R_{AY} = (P2P_{AC} + P2P_{AD} - P2P_{CD})/2$$
$$R_{CY} = (P2P_{AC} + P2P_{CD} - P2P_{AD})/2$$
$$R_{DY} = (P2P_{AD} + P2P_{CD} - P2P_{AC})/2$$

The new P2P value is $R_{CY} \| R_{DY} + R_{AY}$. This three-terminal procedure is replicated to find the five new P2P values between C+D (merged) and each other terminal.

New P2P Values Between Unmerged Nodes

Figure 11B:
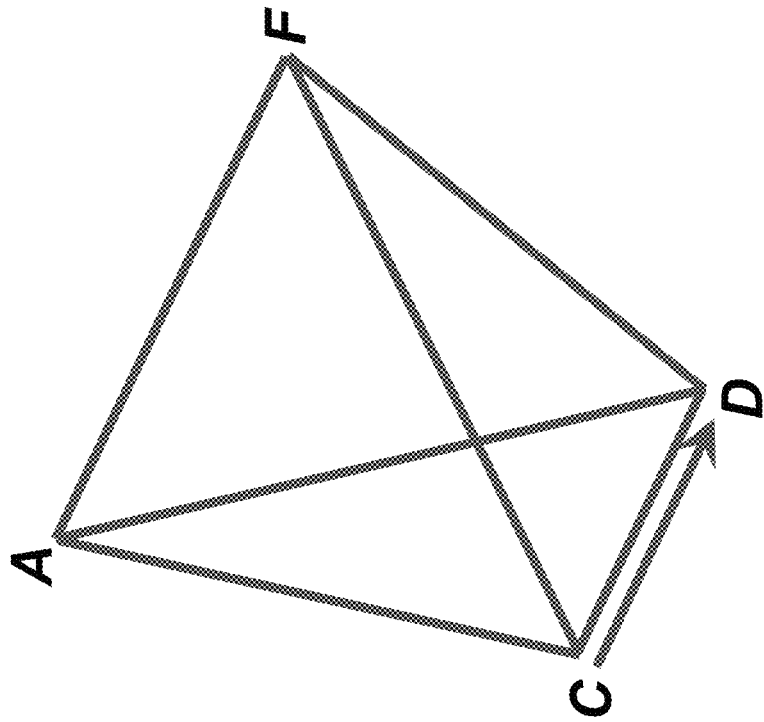
FIGS. 11A and 11B show one embodiment of determining new point-to-point (P2P) resistance values between unmerged nodes in the merged resistor network.
Figure 11A:
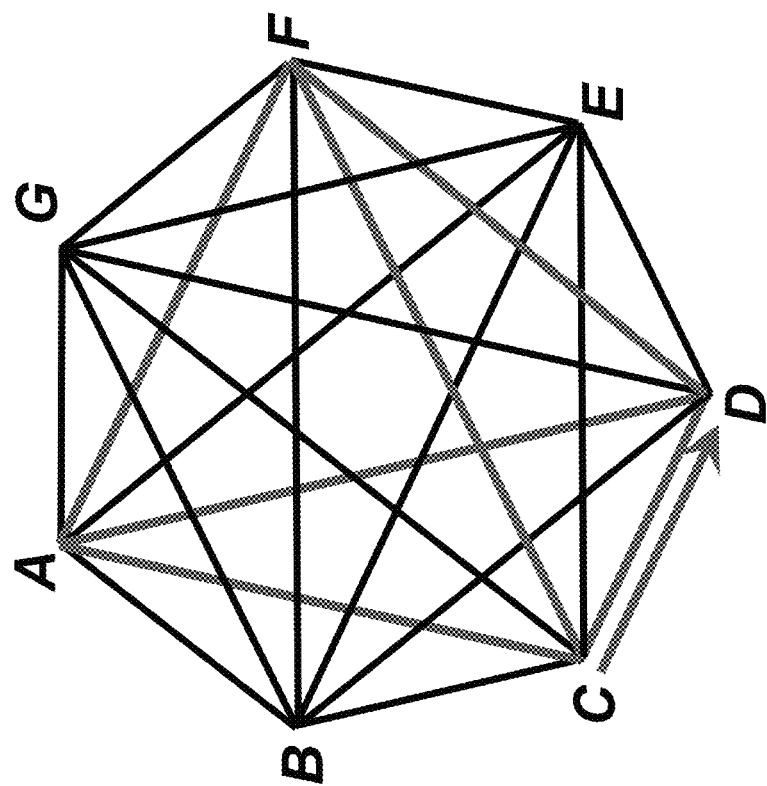

FIGS. 11A and 11B show one embodiment of determining new point-to-point (P2P) resistance values between unmerged nodes in the merged resistor network. Finding the new P2P value between a pair of terminals, neither of which was merged, is similar, but involves consideration of a four-terminal network. To find the new P2P resistance A-to-F, for example, consider the network after reducing B, E, and G as if they were open circuits. This reduced network has the same six P2P values as in the unreduced network. Resistor values of the representative four-terminal resistor network can be found, as discussed above. The new P2P value is then found as:

$$R_{AF} \| (R_{CA} \| R_{DA} + R_{CF} \| R_{DF})$$

This four-terminal procedure is replicated to find the ten new P2P values between each pair of unmerged terminals (A, B, E, F, G).

We discussed, with respect to FIGS. 10 and 11, how to find the fifteen P2P resistance values in the six-terminal network, reduced from the original seven-terminal network. Five values are from C+D to each other node (associated with each dotted line in FIG. 12).

Figure 12:
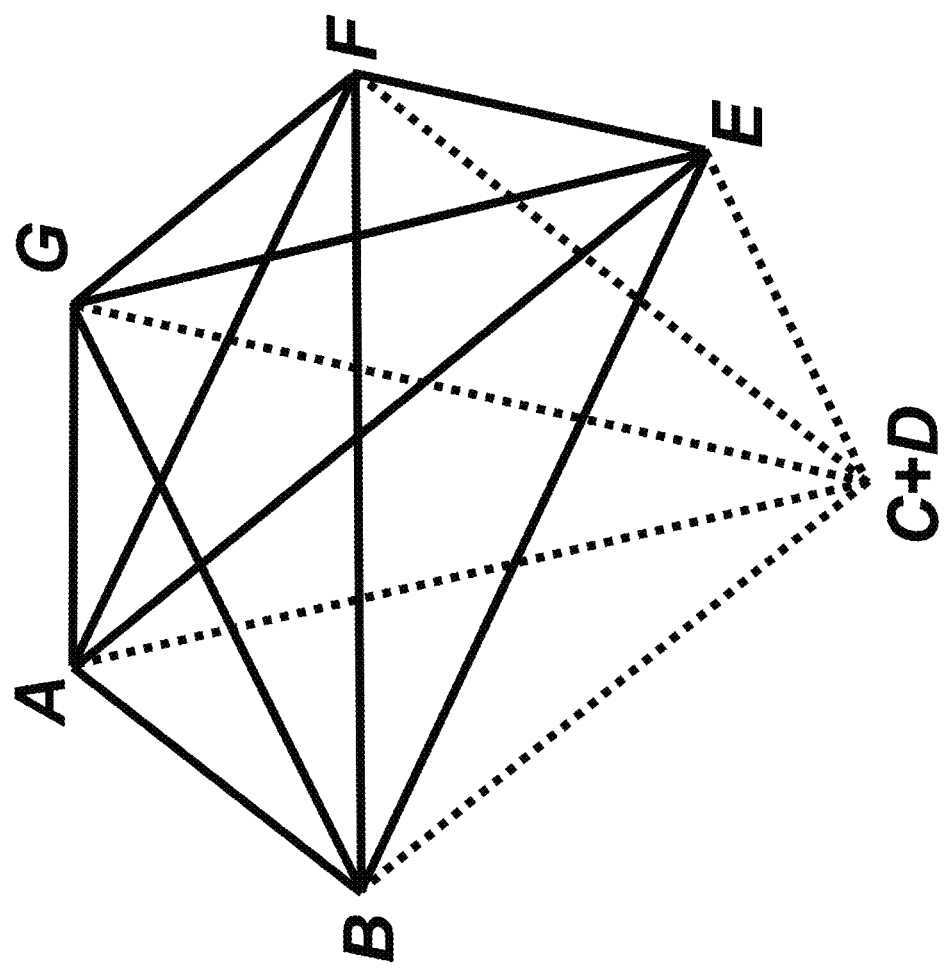
FIG. 12 illustrates five new P2P resistance values determined between the merged node and the unmerged nodes in the merged resistor network.

FIG. 12 illustrates five new P2P resistance values determined between the merged node and the unmerged nodes in the merged resistor network. Ten values are between each other pair of nodes (associated with each solid line). The result is a new (smaller) network for us to solve. Some of the resistors are the same as in the original network (solid lines).

Figure 13C:
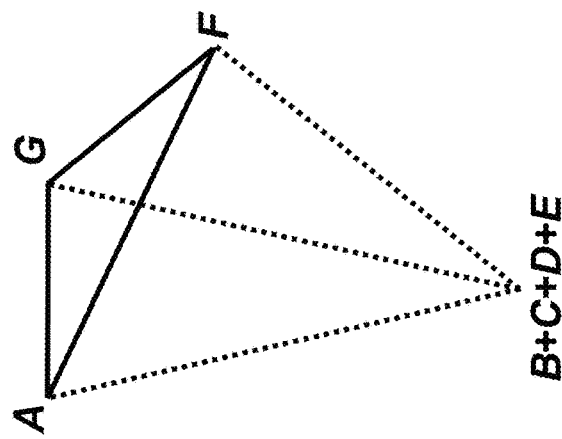
FIGS. 13A, 13B, and 13C show the merged resistor network after merging terminal B with previously merged terminals C+D, and then after merging terminal E with previously merged terminals B+C+D.
Figure 13B:
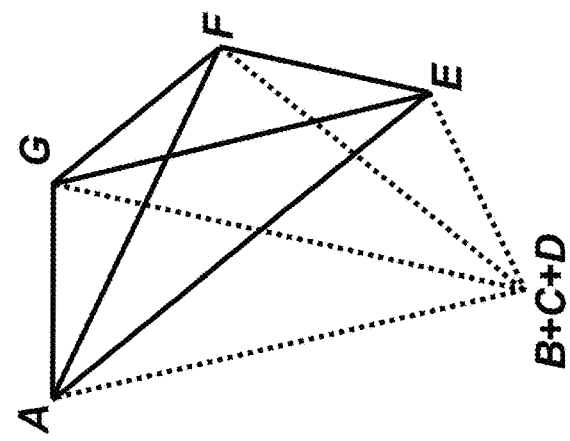
Figure 13A:
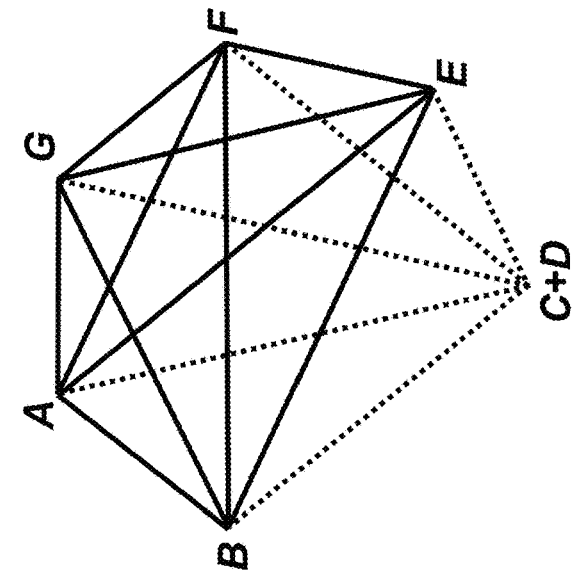

Merging other nodes into C+D (similar procedure) eventually reduces the original seven-terminal network to a four-terminal network. FIGS. 13A, 13B, and 13C show the merged resistor network after merging terminal B with previously merged terminals C+D, and then after merging terminal E with previously merged terminals B+C+D.

After merging terminals B, C, D, and E, we have P2P values for a four-terminal merged resistor network with three unmerged terminals and a single merged node. Three resistors of this network are the same as in the original network: $R_{AF}$, $R_{AG}$, and $R_{FG}$. Because we can solve this with the four-terminal solution discussed above, we can determine these three resistor values. Merging different terminals of the seven-terminal network gives solutions for other resistors in the network. This approach allows us to find the values of all resistors in the network.

Computer System

Figure 15:
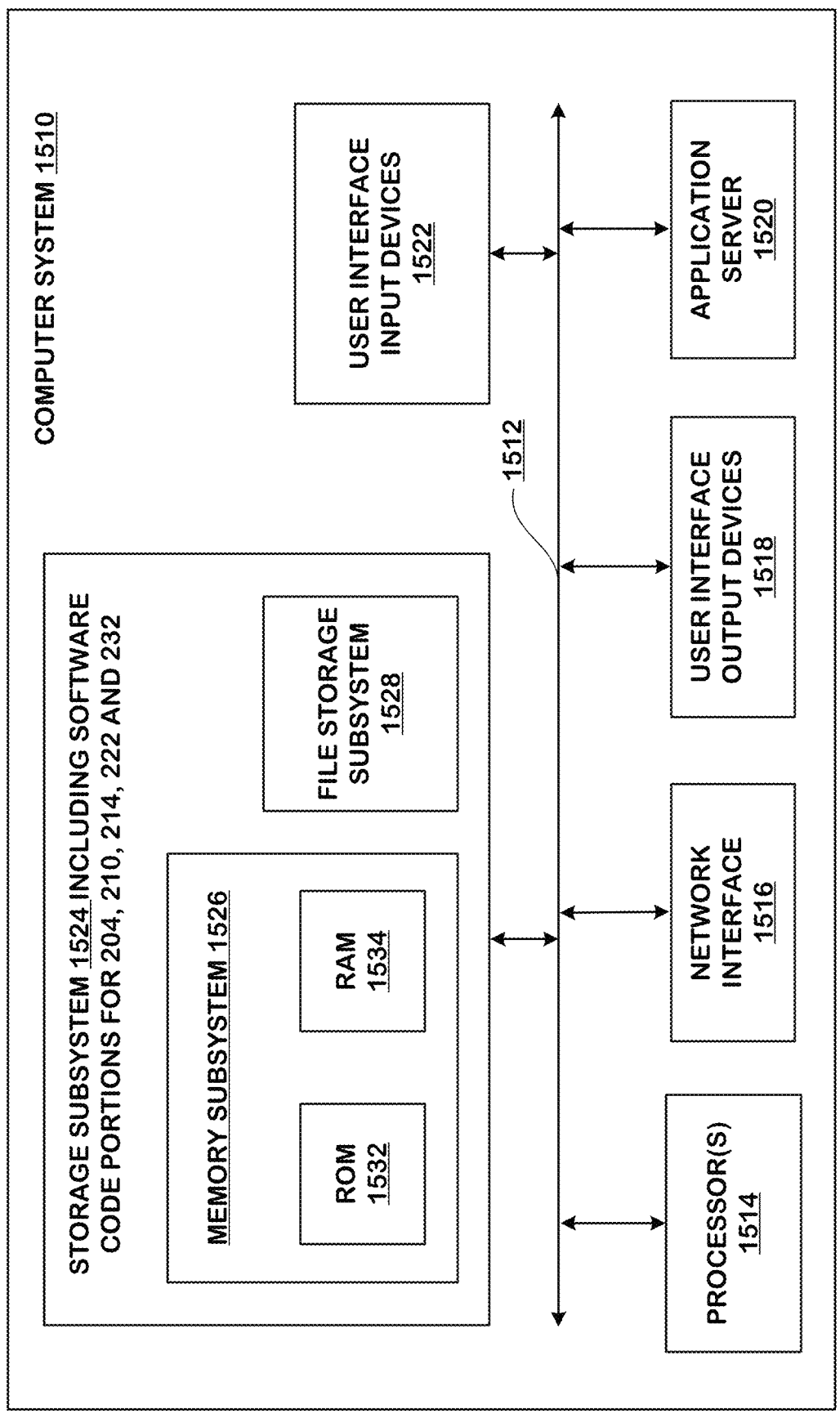
FIG. 15 is a simplified block diagram of a computer system that incorporates aspects of the invention.

FIG. 15 is a simplified block diagram of a computer system 1510 that can be used to implement any of the methods herein. Particularly it can be used to implement modules 204, 210, 214, 216, 222, and/or 232 in various embodiments. It also includes or accesses the databases 202, 208, 212, 216, 218, and/or 222.

Computer system 1510 typically includes a processor subsystem 1514 which communicates with a number of peripheral devices via bus subsystem 1512. These peripheral devices may include a storage subsystem 1524, comprising a memory subsystem 1526 and a file storage subsystem 1528, user interface input devices 1522, user interface output devices 1520, and a network interface subsystem 1516. The input and output devices allow user interaction with computer system 1510. Network interface subsystem 1516 provides an interface to outside networks, including an interface to the communication network 1518, and is coupled via communication network 1518 to corresponding interface devices in other computer systems. Communication network 1518 may comprise many interconnected computer systems and communication links. These communication links may be wireline links, optical links, wireless links, or any other mechanisms for communication of information, but typically it is an IP-based communication network. While in one embodiment, communication network 1518 is the Internet, in other embodiments, communication network 1518 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1522 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 1510 or onto computer network 1518.

User interface output devices 1520 may include a display subsystem, a printer, a fax machine, or non-visual displays such as audio output devices. The display subsystem may include a cathode ray tube (CRT), a flat panel device such as a liquid crystal display (LCD), a projection device, or some other mechanism for creating a visible image. The display subsystem may also provide a nonvisual display such as via audio output devices. In general, use of the term "output device" is intended to include all possible types of devices and ways to output information from computer system 1510 to the user or to another machine or computer system.

Storage subsystem 1524 stores the basic programming and data constructs that provide the functionality of certain embodiments of the present invention. For example, the various modules implementing the functionality of certain embodiments of the invention may be stored in storage subsystem 1524. These software modules are generally executed by processor subsystem 1514. The databases 202, 208, 212, 216, 218, and/or 222 may reside in storage subsystem 1524.

Memory subsystem 1526 typically includes a number of memories including a main random access memory (RAM) 1534 for storage of instructions and data during program execution and a read-only memory (ROM) 1532 in which fixed instructions are stored. File storage subsystem 1528 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 1528. The host memory 1526 contains, among other things, computer instructions which, when executed by the processor subsystem 1514, cause the computer system to operate or perform functions as described herein. As used herein, processes and software that are said to run in or on "the host" or "the computer," execute on the processor subsystem 1514 in response to computer instructions and data in the host memory subsystem 1526 including any other local or remote storage for such instructions and data.

Bus subsystem 1512 provides a mechanism for letting the various components and subsystems of computer system 1510 communicate with each other as intended. Although bus subsystem 1512 is shown schematically as a single bus, alternative embodiments of the bus subsystem may use multiple busses.

Computer system 1510 itself can be of varying types including a personal computer, a portable computer, a workstation, a computer terminal, a network computer, a television, a mainframe, a server farm, or any other data processing system or user device. Due to the ever-changing nature of computers and networks, the description of computer system 1510 depicted in FIG. 15 is intended only as a specific example for purposes of illustrating the preferred embodiments of the present invention. Many other configurations of computer system 1510 are possible having more or less components than the computer system depicted in FIG. 15.

In addition, while the present invention has been described in the context of a fully functioning data processing system, those of ordinary skill in the art will appreciate that the processes herein are capable of being distributed in the form of a computer readable medium of instructions and data and that the invention applies equally regardless of the particular type of signal bearing media actually used to carry out the distribution. As used herein, a computer readable medium is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD ROMs or a plurality of segments of RAM, or a combination of several different kinds of media. As used herein, the term does not include mere time-varying signals in which the information is encoded in the way the signal varies over time.

Various terminology is utilized herein, and should be interpreted according to its conventional meaning in the relevant arts, unless otherwise defined below:

As used herein, a given value is "responsive" to a predecessor value if the predecessor value influenced the given value. If there is an intervening processing element, step or time period, the given value can still be "responsive" to the predecessor value. If the intervening processing element or step combines more than one value, the signal output of the processing element or step is considered "responsive" to each of the value inputs. If the given value is the same as the predecessor value, this is merely a degenerate case in which the given value is still considered to be "responsive" to the predecessor value. "Dependency" of a given value upon another value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

"Computer model" in this context refers to the logic (e.g., algorithms and equations) that represent the behavior of the system being modeled. Computer simulation is the actual execution of logic comprising these equations or algorithms. Simulation, therefore, is the process of executing a model.

"Circuitry" in this context refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

"Firmware" in this context refers to software logic embodied as processor-executable instructions stored in read-only memories or media.

"Hardware" in this context refers to logic embodied as analog or digital circuitry.

"Logic" in this context refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Programmable device" in this context refers to an integrated circuit designed to be configured and/or reconfigured after manufacturing. The term "programmable processor" is another name for a programmable device herein. Programmable devices may include programmable processors, such as field programmable gate arrays (FPGAs), configurable hardware logic (CHL), and/or any other type programmable devices. Configuration of the programmable device is generally specified using a computer code or data such as a hardware description language (HDL), such as for example Verilog, VHDL, or the like. A programmable device may include an array of programmable logic blocks and a hierarchy of reconfigurable interconnects that allow the programmable logic blocks to be coupled to each other according to the descriptions in the HDL code. Each of the programmable logic blocks may be configured to perform complex combinational functions, or merely simple logic gates, such as AND, and XOR logic blocks. In most FPGAs, logic blocks also include memory elements, which may be simple latches, flip-flops, hereinafter also referred to as "flops," or more complex blocks of memory. Depending on the length of the interconnections between different logic blocks, signals may arrive at input terminals of the logic blocks at different times.

"Selector" in this context refers to a logic element that selects one of two or more inputs to its output as determined by one or more selection controls. Examples of hardware selectors are multiplexers and demultiplexers. An example software or firmware selector is: if (selection_control==true) output=input1; else output=input2; Many other examples of selectors will be evident to those of skill in the art, without undo experimentation.

"Software" in this context refers to logic implemented as processor-executable instructions in a machine memory (e.g. read/write volatile or nonvolatile memory or media which can be non-transitory).

"Switch" in this context refers to logic to select one or more inputs to one or more outputs under control of one or more selection signals. Examples of hardware switches are mechanical electrical switches for switching power to circuits, devices (e.g., lighting), or motors. Other examples of hardware switches are solid-state switches such as transistors. An example of a hardware or firmware switch is: if (selection==true) output=input; else output=0; A somewhat more complicated software/firmware switch is: if (selection1==true and selection2==true) output=input1; else if (selection1==true and selection2==false) output=input2; else if (selection1==false and selection2==true) output=input3; else output=noOp; Switches operate similarly to selectors in many ways (see the definition of Selector), except in some cases switches may select all inputs to the output, (s) not select among inputs. Other examples of switches will be readily apparent to those having skill in the art, without undo experimentation.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

Macrocell Implementations

A circuit or layout that includes a nano-scale structure as described herein can be designed in advance and provided to designers as a macrocell (which as used herein can be a standard cell). It is common for integrated circuit designers to take advantage of macrocells that have been pre-designed for particular kinds of circuits, such as logic gates, larger logic functions, memory (including SRAM) and even entire processors or systems. These macrocells are provided in a library available from various sources, such as foundries, ASIC companies, semiconductor companies, third party IP providers, and even EDA companies, and used by designers when designing larger circuits. Each macrocell typically includes such information as a graphical symbol for schematic drawings; text for a hardware description language such as Verilog; a netlist describing the devices in the included circuit, the interconnections among them, and the input and output nodes; a layout (physical representation) of the circuit in one or more geometry description languages such as GDSII; an abstract of the included geometries for use by place-and-route systems; a design rule check deck; simulation models for use by logic simulators and circuit simulators; and so on. Some libraries may include less information for each macrocell, and others may include more. In some libraries the entries are provided in separate files, whereas in others they are combined into a single file, or one file containing the entries for multiple different macrocells. In all cases the files are either stored and distributed on a computer readable medium, or delivered electronically and stored by the user on a computer readable medium. Macrocell libraries often contain multiple versions of the same logic function differing in area, speed and/or power consumption, in order to allow designers or automated tools the option to trade off among these characteristics. A macrocell library can also be thought of as a database of macrocells. As used herein, the term "database" does not necessarily imply any unity of structure. For example, two or more separate databases, when considered together, still constitute a "database" as that term is used herein. As such, the entries defining each single macrocell can also be thought of as a "database". It can be seen that aspects of the invention also may be present in macrocells and macrocell libraries.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description, it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A computer-implemented method executed by an integrated circuit design tool for determining resistor values between n terminals of a network using known point-to-point resistance values between the n terminals, the method including:
   initializing a resistor network in which nodes represent the n terminal and edges between the nodes represent the known point-to-point resistance values, and storing the resistor network in a database in the memory;
   determining the resistor values between each of the nodes by
      initializing a merged version of the resistor network by combining a starting node pair from among the nodes into a merged node;
      using the known point-to-point resistance values to determine new known point-to-point resistance values (i) between the merged node and unmerged nodes in the merged version of the resistor network and (ii) between the unmerged nodes in the merged version of the resistor network;
      iteratively shrinking the merged version of the resistor network such that, at each successive iteration, the merged version of the resistor network has an additional one of the nodes merged into the merged node and therefore one less unmerged node, and at each iteration, determining the new known point-to-point resistance values;
      when the merged version of the resistor network has iteratively shrunken to having only three unmerged nodes, using a four-terminal solution to determine the resistor values between the three unmerged nodes, and terminating the iterative shrinking; and
      until the resistor values between each of the nodes are determined, initializing different merged versions of the resistor network by combining different starting node pairs from among the nodes into the merged node and using the iterative shrinking and the four-terminal solution to determine the resistor values between different combinations of the three unmerged nodes.

2. The computer-implemented method of claim 1, further including:
   using the known point-to-point resistance values to determine the new known point-to-point resistance values between the merged node and the unmerged nodes in the merged version of the resistor network by
      applying a three-terminal solution that uses the merged node and one other unmerged node.

3. The computer-implemented method of claim 2, wherein the three-terminal solution treats nodes in the merged version of the resistor network other than the merged node and one other unmerged node as floating nodes that are unconnected and have no net input current and no voltage.

4. The computer-implemented method of claim 1, further including:
   using the known point-to-point resistance values to determine the new known point-to-point resistance values between the unmerged nodes in the merged version of the resistor network by
      applying a four-terminal solution that uses the merged node and two other unmerged node.

5. The computer-implemented method of claim 4, wherein the four-terminal solution treats nodes in the merged version of the resistor network other than the merged node and two other unmerged node as floating nodes that are unconnected and have no net input current and no voltage.

6. The computer-implemented method of claim 1, further including:
   generating the merged node by shorting and connecting those nodes that are merged into the merged node and assigning them a same voltage.

7. A non-transitory computer readable storage medium impressed with computer program instructions to determine resistor values between n terminals of a network using known point-to-point resistance values between the n terminals, the instructions, when executed on a processor, implement a method comprising:
   initializing a resistor network in which nodes represent the n terminal and edges between the nodes represent the known point-to-point resistance values, and storing the resistor network in a database in the memory;
   determining the resistor values between each of the nodes by
      initializing a merged version of the resistor network by combining a starting node pair from among the nodes into a merged node;
      using the known point-to-point resistance values to determine new known point-to-point resistance values (i) between the merged node and unmerged nodes in the merged version of the resistor network and (ii) between the unmerged nodes in the merged version of the resistor network;
      iteratively shrinking the merged version of the resistor network such that, at each successive iteration, the merged version of the resistor network has an additional one of the nodes merged into the merged node and therefore one less unmerged node, and at each iteration, determining the new known point-to-point resistance values;
      when the merged version of the resistor network has iteratively shrunken to having only three unmerged nodes, using a four-terminal solution to determine the resistor values between the three unmerged nodes, and terminating the iterative shrinking; and
      until the resistor values between each of the nodes are determined, initializing different merged versions of the resistor network by combining different starting node pairs from among the nodes into the merged node and using the iterative shrinking and the four-terminal solution to determine the resistor values between different combinations of the three unmerged nodes.

8. The non-transitory computer readable storage medium of claim 7, implementing the method further comprising:
   using the known point-to-point resistance values to determine the new known point-to-point resistance values between the merged node and the unmerged nodes in the merged version of the resistor network by
      applying a three-terminal solution that uses the merged node and one other unmerged node.

9. The non-transitory computer readable storage medium of claim 8, wherein the three-terminal solution treats nodes in the merged version of the resistor network other than the merged node and one other unmerged node as floating nodes that are unconnected and have no net input current and no voltage.

10. The non-transitory computer readable storage medium of claim 7, implementing the method further comprising:
    using the known point-to-point resistance values to determine the new known point-to-point resistance values between the unmerged nodes in the merged version of the resistor network by applying a four-terminal solution that uses the merged node and two other unmerged node.

11. The non-transitory computer readable storage medium of claim 10, wherein the four-terminal solution treats nodes in the merged version of the resistor network other than the merged node and two other unmerged node as floating nodes that are unconnected and have no net input current and no voltage.

12. The non-transitory computer readable storage medium of claim 7, implementing the method further comprising:
    generating the merged node by shorting and connecting those nodes that are merged into the merged node and assigning them a same voltage.

13. A system including one or more processors coupled to memory, the memory loaded with computer instructions to determine resistor values between n terminals of a network using known point-to-point resistance values between the n terminals, the instructions, when executed on the processors, implement actions comprising:
    initializing a resistor network in which nodes represent the n terminal and edges between the nodes represent the known point-to-point resistance values, and storing the resistor network in a database in the memory;
    determining the resistor values between each of the nodes by
        initializing a merged version of the resistor network by combining a starting node pair from among the nodes into a merged node;
        using the known point-to-point resistance values to determine new known point-to-point resistance values (i) between the merged node and unmerged nodes in the merged version of the resistor network and (ii) between the unmerged nodes in the merged version of the resistor network;
        iteratively shrinking the merged version of the resistor network such that, at each successive iteration, the merged version of the resistor network has an additional one of the nodes merged into the merged node and therefore one less unmerged node, and at each iteration, determining the new known point-to-point resistance values;
        when the merged version of the resistor network has iteratively shrunken to having only three unmerged nodes, using a four-terminal solution to determine the resistor values between the three unmerged nodes, and terminating the iterative shrinking; and
    until the resistor values between each of the nodes are determined, initializing different merged versions of the resistor network by combining different starting node pairs from among the nodes into the merged node and using the iterative shrinking and the four-terminal solution to determine the resistor values between different combinations of the three unmerged nodes.

14. The system of claim 13, implementing actions further comprising:
    using the known point-to-point resistance values to determine the new known point-to-point resistance values between the merged node and the unmerged nodes in the merged version of the resistor network by
        applying a three-terminal solution that uses the merged node and one other unmerged node.

15. The system of claim 14, wherein the three-terminal solution treats nodes in the merged version of the resistor network other than the merged node and one other unmerged node as floating nodes that are unconnected and have no net input current and no voltage.

16. The system of claim 13, implementing actions further comprising:
    using the known point-to-point resistance values to determine the new known point-to-point resistance values between the unmerged nodes in the merged version of the resistor network by
        applying a four-terminal solution that uses the merged node and two other unmerged node.

17. The system of claim 16, wherein the four-terminal solution treats nodes in the merged version of the resistor network other than the merged node and two other unmerged node as floating nodes that are unconnected and have no net input current and no voltage.

18. The system of claim 13, implementing actions further comprising:
    generating the merged node by shorting and connecting those nodes that are merged into the merged node and assigning them a same voltage.

\* \* \* \* \*